United States Patent [19]

Baudrant et al.

[11] Patent Number: 4,714,951
[45] Date of Patent: Dec. 22, 1987

[54] INTEGRATED CIRCUIT DEVICE WHICH INCLUDES A CONTINOUS LAYER WHICH CONSISTS OF CONDUCTING PORTIONS WHICH ARE OF A SILICIDE OF A REFRACTORY METAL AND INSULATING PORTIONS WHICH ARE OF AN OXIDE OF THE METAL

[75] Inventors: Annie Baudrant, St. Martin D'Heres; Michel Marty, Grenoble, both of France

[73] Assignee: Societe pour d'Etude et la Fabrication de Circuits Integres Speciaux EFCIS, Grenoble, France

[21] Appl. No.: 833,845

[22] Filed: Feb. 26, 1986

Related U.S. Application Data

[62] Division of Ser. No. 673,425, Nov. 20, 1984, Pat. No. 4,593,454.

[30] Foreign Application Priority Data

Nov. 22, 1983 [FR] France ............................ 8318565

[51] Int. Cl.[4] ............... H01L 29/78; H01L 27/02; H01L 23/48
[52] U.S. Cl. ............................. 357/67; 357/23.9; 357/41; 357/59; 357/54; 357/71
[58] Field of Search ............... 357/23.15, 42, 54, 23.9, 357/67 S, 71 S, 59 I, 23.1, 23.3, 41

[56] References Cited

U.S. PATENT DOCUMENTS

| | | | |
|---|---|---|---|
| 3,690,945 | 9/1972 | Kuisl ............................ | 357/23.15 |
| 4,305,200 | 12/1981 | Fu et al. ........................ | 357/41 |
| 4,329,706 | 5/1982 | Crowder et al. ................ | 357/23.9 |
| 4,374,700 | 2/1983 | Scott et al. .................... | 357/59 I |
| 4,543,592 | 9/1985 | Itsumi et al. ................... | 357/41 |
| 4,574,467 | 3/1986 | Halfacre et al. ................ | 357/42 |

FOREIGN PATENT DOCUMENTS

53-17393  7/1978  Japan ............................... 357/67 S

OTHER PUBLICATIONS

"Selective Oxidation of Titanium while forming Titanium-Silicide at Polysilicon and Diffusions", *IBM Technical Disclosure Bulletin*, vol. 27, (1985), pp. 5870-5875.
F. Mohammadi, "Silicides for Interconnection Technology", *Solid State Technology*, (Jan. 1981), pp. 65-72.
R. B. Laibowitz et al., "Fabrication of Vias in a Multilayered Metallization in LSI Technology", *IBM Technical Disclosure Bulletin*, vol. 21, (1979), pp. 5051-5052.
T. M. Reith, "Improved Reliability for Al-Cu-Si Overlay Films", *IBM Technical Disclosure Bulletin*, vol. 20, (1977), pp. 1373-1374.
E. E. Conrad, "Aluminum-Copper-Silicon Semiconductor Metallurgy", *IBM Technical Disclosure Bulletin*, vol. 13, (1971), p. 3661.

*Primary Examiner*—J. Carroll
*Attorney, Agent, or Firm*—Roland Plottel

[57] ABSTRACT

The invention concerns an integrated circuit the monocrystalline or polycrystalline silicon zones of which the source, gate and drain are covered with tantalum silicide $TaSi_2$ while the remainder of the slice is covered with portions of a layer of tantalum oxide $Ta_2O_5$, especially on the sides of the grids of polycrystalline silicon and on the thick oxide and an aluminum alloy layer comes into contact with the tantalum silicide to form connections with the portions of tantalum silicide.

7 Claims, 7 Drawing Figures

INTEGRATED CIRCUIT DEVICE WHICH INCLUDES A CONTINOUS LAYER WHICH CONSISTS OF CONDUCTING PORTIONS WHICH ARE OF A SILICIDE OF A REFRACTORY METAL AND INSULATING PORTIONS WHICH ARE OF AN OXIDE OF THE METAL

This application is a division of application Ser. No. 673,425, filed Nov. 20, 1984 now U.S. Pat. No. 4,593,454.

Background of the Invention

The present invention concerns integrated circuits. The invention will be described in detail with respect to the manufacture of insulated gate field effect transistor circuits having a polycrystalline silicon gate insulated a thin layer of silicon oxide, but it can also be applied to other circuits, for example, bipolar transistor circuits.

Description of the Prior Art

In many integrated circuits, large zones of doped silicon act to conduct a non-negligible current and it is essential to reduce as much as possible the electric resistance of these zones. This is the reason why it has been proposed to form on these zones metal alloy layers, such as platinum, titanium, and tantalum silicide layers which have the advantage of a very high conductivity.

Platinum has the drawback of being very expensive; titanium "absorbs" a great amount of oxygen during the manufacturing phases which follow its deposit, which is prejudicial to its conductivity; furthermore, the silicides of these metals often have poor resistance to chemical agents; for example; titanium silicide is soluble in hydrofluoric acid HF which is frequently used to clean the slices. Tantalum and its silicide on the contrary have very good resistance to this type of chemical agent; unfortunately, they have proved very difficult to etch since, if etching is carried out with a plasma, the tantalum silicide that it is desired to preserve is attacked more rapidly than the tantalum that it is desired to eliminate; if, on the other hand, it is desired to etch by chemical means, baths at 80° C. are required that are difficult to utilize in mass production.

SUMMARY OF THE INVENTION

The present invention proposes an integrated circuit structure and a corresponding manufacturing process, this structure utilizing tantalum and thus making the most of its advantages without presenting its drawbacks; essentially, instead of trying to remove the tantalum where it is not desired or where it is not desired to mix it with the silicon, it is maintained in the form of insulating tantalum oxide; the circuit structure according to the invention is designed so that an unbroken layer containing tantalum is present along the whole slice, this layer being constituted by portions of a layer of tantalum silicide in direct contact with the silicon in certain zones and by portions of a layer of tantalum oxide in contact with the silicon oxide on the whole of the remainder of the slice.

More specifically, the integrated circuit according to the invention comprises monocrystalline and/or polycrystalline silicon zones, certain of which at least are connected to connections forming part of an interconnecting conductive layer; these zones are essentially completely covered with tantalum silicide and are separated from one another by portions of a tantalum oxide layer lying on an insulating oxide (generally silicon oxide), the interconnecting conductive layer being in contact with the tantalum silicide on one part of the thus covered silicon zones.

For field effect transistors having a polycrystalline silicon gate insulated by thin layers of silicon oxide, the areas of sources and drains of the transistors are covered with tantalum silicide, as well as the upper surface of the polycrystalline silicon gates; the sides of the gates are covered with a deposit of silicon oxide covered with tantalum oxide completely filling the spaces separating the tantalum silicide of the sources and drains from the tantalum silicide of the gates.

The manufacturing process used to obtain this structure is the following:

on a slice are conventionally formed bare zones of silicon separated by zones where an insulator (silicon oxide) is present on the surface of the slice;

a layer of tantalum is uniformly deposited on the whole of the surface of the slice;

the slice is subjected to a temperature of about 750° C. in the presence of a neutral gas, preferably argon, in dry atmosphere, in order to form tantalum silicide everywhere the tantalum covers directly the bare silicon and in order to maintain the tantalum unconverted in sites where it covers the insulator (silicon oxide);

the slice is subjected to a temperature of about 200° to 500° C. in the presence of an oxidizing gas, preferably oxygen, in dry atmosphere, in order to oxidize the tantalum without oxidizing the tantalum silicide;

the manufacturing process is continued without eliminating the remaining tantalum oxide; especially, an insulating layer is deposited which is etched in order to open it above the portions of tantalum silicide zones, a metal layer (for example, an aluminum silicon alloy) is deposited and then etched according to the interconnecting pattern selected.

The structure according to the invention has the advantage of eliminating any risk of short-circuiting through the formation of tantalum silicide or tantalum bridges between two zones of silicon which have to remain insulated, for example, between the gate and the source or the drain of a transistor. Furthermore, the tantalum silicide can cover very widely the silicon areas where it is desired to reduce the resistance, the limit of these areas being practically always determined by a silicon oxide zone that will delimit by self-alignment the separation between a tantalum silicide zone and a tantalum oxide zone.

In the manufacturing process, no masking stage will be necessary in order to define the tantalum silicide zones and therefore no difficulty will be encountered for patterning the tantalum or tantalum silicide.

In particular, prior to the tantalum deposit, silicon oxide will be deposited by decomposition in a gaseous phase, an oxide that can be etched uniformly according to an anisotropic vertical attack until the underlying monocrystalline and polycrystalline silicon are exposed bare, while preserving along the length of the sides of the polycrystalline silicon gates insulating oxide deposits that will prevent any formation of silicide on these sides.

BRIEF DESCRIPTION OF THE DRAWING

Other features and advantages of the invention will become apparent from reading through the following detailed description given with reference to the appended drawings in which.

DESCRIPTION OF THE PREFERRED EMBODIMENTS

Figure 1:
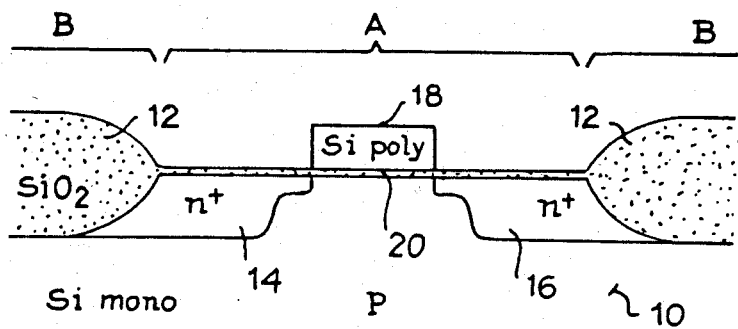
FIGS. 1 to 7 represent the product at successive steps of the process for producing an integrated circuit according to the invention, incorporating field effect transistors.

The conventional steps of producing the transistors itself will not be described in detail; in an initial monocrystalline silicon slice 10 active zones A are defined, insulated from one another by thick silicon oxide zones B 12 (FIG. 1). Implantations and diffusions of source 14 and drain 16 are carried out after having deposited and patterned a polycrystalline silicon layer defining especially the gates 18 of the transistors, these grids lying over a thin silicon oxide gate layer 20. The gate acts as implantation mask during a source and drain implantation step. Generally, additionally, a source and drain deep diffusion step is performed and this is the reason why in FIG. 1 source and drain areas have been represented in the form of stairs with a shallow region self-aligned with the edge of the gate and a deep diffusion in the rest of the active zone A outside the gate and its immediate edges.

Several manufacturing processes are known and it will thus be considered that there is no difficulty for one skilled in the art of obtaining the structure of FIG. 1 or other MOS technology or bipolar structures for which the invention can be useful.

In the initial structure of FIG. 1, it is desired that the source and drain diffusion, that can interconnect several transistors, as well as polycrystalline gates, have as low a resistance as possible (this is furthermore one of the reasons for the existence of source and drain deep diffusions).

Figure 7:
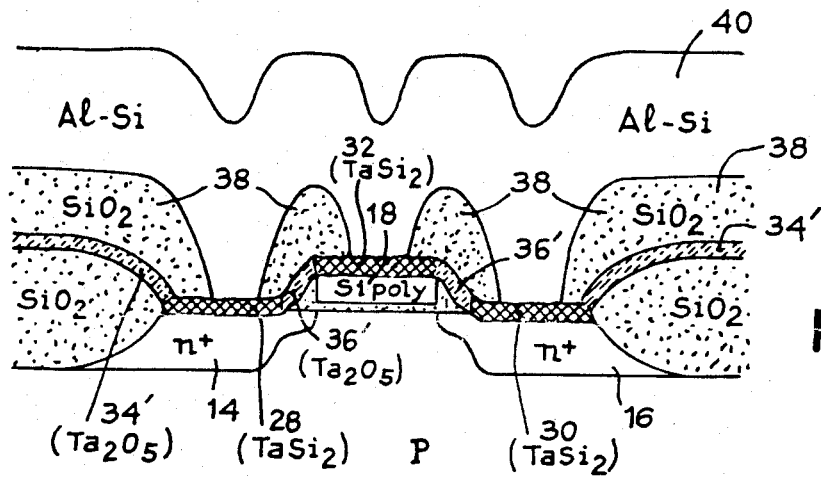

To do this, the invention proposes realizing a structure the final form of which is represented in FIG. 7 and which will be realized in the following way.

Figure 2:
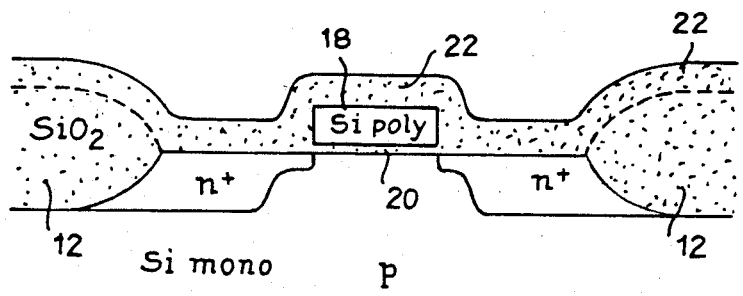

Firstly, a silicon oxide layer 22 is deposited by chemical decomposition in gaseous phase at low pressure. The covering power of this deposit is high so that the layer is rounded about the edges of the gate and largely fills the right angle formed by the sides of the gate 18 and the monocrystalline silicon surface 10 (FIG. 2).

Figure 3:
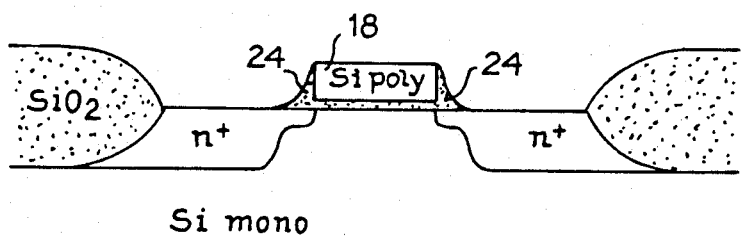

The silicon oxide present is then uniformly etched, and this etching is carried out by vertical anisotropic attack. The engraving is interrupted when the monocrystalline silicon as well as the polycrystalline silicon of the gate are exposed bare. The etching is not continued, so that there remains, due to the anisotropy of the etching, deposits 24 of silicon oxide covering the sides of the gate 18 and filling the corner formed by the side of the gate and the surface of the monocrystalline silicon of the slice. The etching is, for example, a reactive ionic plasma etching that can be followed by stripping with SF6 plasma, performed in the same chamber which will be used for the following tantalum deposition step (two chamber housing), in such a way as to clean thoroughly the monocrystalline and polycrystalline silicon without subjecting it again thereafter to an oxidizing atmosphere (FIG. 3).

Figure 4:
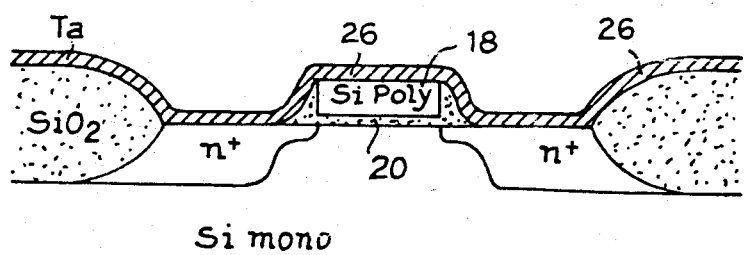

A uniform layer 26 of tantalum having a thickness that can be about 600 angströms is then deposited in any suitable known manner, for example, by evaporation or sputtering in the chamber used for the previous etching. The covering power is equally sufficient for the deposited tantalum layer not to be subject to any discontinuity at the steps constituted by the polycrystalline silicon gates (FIG. 4).

In a usual silicide formation processes, it would be necessary to etch the deposited metal in order to separate the metal covering the gate from the metal covering the source and from the metal covering the drain.

Figure 5:
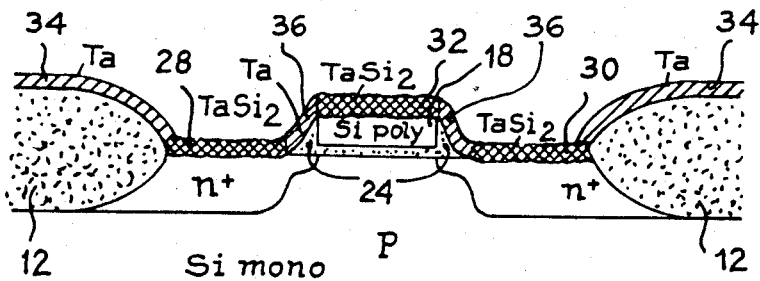

Then, in the instant process, the slice is subjected to a temperature of about 750° C. for a period of about 30 minutes in a dry atmosphere, in the presence of a neutral gas, preferably argon. A layer of tantalum silicide $TaSi_2$ is thus formed in the sites where the tantalum is directly in contact with the monocrystalline silicon (zones 28 and 30 above the source and the drain) or with the polycrystalline silicon (zone 32 above the gate) but the tantalum does not react with the silicon in the sites where it lies on the silicon oxide, namely both in the regions 34 covering the thick oxide 12 and in the regions 36 above the silicon oxide side deposits 24 (FIG. 5).

There is now a short-circuit between the sources, drains and gates of the transistors through the intermediary of the tantalum in regions 34 and 36 overlaying the edge deposits, but already the tantalum silicide zones are differentiated from the pure tantalum zones and this has been done in a self-aligning manner, i.e. without a masking step; the silicide is truly formed over the entire silicon portion which has been exposed bare at the step of FIG. 3.

It is necessary to eliminate the short-circuits formed by the pure tantalum of regions 34 and 36 but, if etching by plasma is attempted, the $TaSi_2$ alloy is attacked more rapidly than the pure tantalum. A chemical etching is possible to eliminate solely the pure tantalum but it would necessitate a bath at 80° C. which is impractical for in mass production.

Rather than using such an etching, the slice is subjected to an oxidation at low temperature (between 200° C. and 500° C.), in dry atmosphere, for example, in the presence of dry oxygen, so as to oxidize the pure tantalum without oxidizing the tantalum silicon. At this temperature, this step is totally inert with respect to the constituents other than the pure tantalum.

Figure 6:
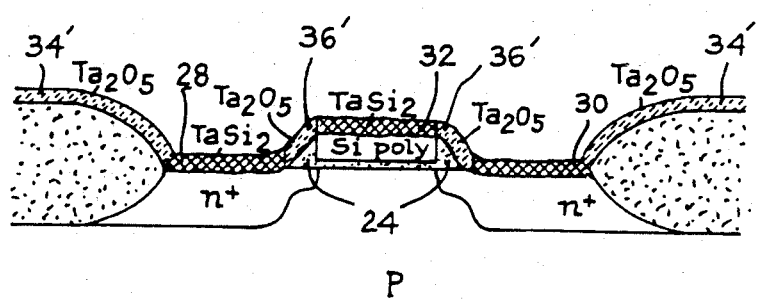

The duration of the oxidation typically is about one hour so as to transform completely the thickness of the tantalum of regions 34 and 36 into tantalum oxide $Ta_2O_5$ (regions 34' and 36'). The tantalum oxide is a very good insulator (FIG. 6).

Without need to etch the tantalum oxide or the tantalum silicide, the process continues with the step of depositing over the whole at low temperature a thick silicon oxide layer (about 6000 Angströms). This layer is then etched in the usual fashion in order to form openings for use as contact points on portions of the tantalum silicide layers. A metallic interconnecting layer is then deposited over the whole which can be an aluminum based alloy, for example Al-Si or Al-Si-Cu or Al-Ta (FIG. 7).

This layer is then etched to leave the the desired interconnecting pattern, the surface of the substrate is passivated and contact pads are opened for bonding wires to the housing of the circuit (steps not represented). These may all be done in the usual fashion.

Therefore, in the structure of the integrated circuit according to the invention, shown in FIG. 7 at its almost final stage, all the zones of monocrystalline or polycrystalline silicon that are not covered directly by the silicon oxide are completely covered with tantalum silicide; this is the case of the largest part of the source and drain zones; this is also the case for the whole of the upper face of the gate; these zones of silicon covered with tantalum silicide are separated by unbroken or continuous portions of a tantalum oxide layer lying over silicon oxide; this is the case above the thick field oxide which separates the transistors, this is also the case between the source and the gate or between the drain and the gate of a single transistor. An interconnecting conductive layer comes locally by way of openings in an insulating layer into contact with the tantalum silicide on portions of the silicon zones covered with tantalum silicide. It is possible to envisage the interconnecting conductive layer being constituted not by an aluminum alloy, but, for example, by polycrystalline silicon which itself can be alloyed in the form of silicide to another metal deposited on this polycrystalline silicon, thus constituting a first interconnecting level over which it is eventually possible to form other interconnecting levels.

It should be understood that the present invention is even applicable to integrated circuits formed on substrates other than silicon (insulating substrates or substrates of another semiconductor).

We claim:

1. An integrated circuit device including
   a semiconductive chip having a plurality of separate silicon surface regions to each of which a low resistance electrical connection is to be provided,
   an insulating oxide layer overlying portions of the chip between said separate surface regions, and
   a continuous layer overlying said chip consisting of conducting portions and insulating portions,
   the conducting portions being of a silicide of a given refractory metal and contiguous to the silicon surface regions for providing low resistance electrical connection thereto, and
   the insulating portions being of an oxide of the given metal and contiguous to the insulating oxide layer.

2. The integrated circuit device of claim 1 in which the insulating oxide layer is a silicon oxide layer.

3. The integrated circuit device of claim 2 in which the separate silicon surface regions include the monocrystalline source and drain regions of a transistor and the polycrystalline silicon gate region of the transistor and the silicon oxide layer covers the sidewalls of the gate region.

4. The integrated circuit device of claim 2 in which the given metal is tantalum.

5. The integrated circuit device of claim 2 in which the conducting portions of the continuous layer are coextensive with the silicon surface regions and the insulating portions are coexistent with the silicon oxide portions.

6. The integrated circuit device of claim 2 in which the conducting portions of the continuous layer are formed as reaction products of the refractory metal and the silicon surface regions underlying the conducting portions and the insulating portions are formed as the reaction products of the refractory metal and the underlying oxide layer.

7. The integrated circuit device of claim 6 in which the refractory metal is tantalum and the insulating oxide is silicon oxide.

* * * * *